(12) United States Patent
Rasalingam et al.

(10) Patent No.: US 12,342,458 B2
(45) Date of Patent: Jun. 24, 2025

(54) LEAD FINGER FOR PRINTED CIRCUIT BOARD

(71) Applicant: Western Digital Technologies, Inc., San Jose, CA (US)

(72) Inventors: Uthayarajan A/L Rasalingam, Penang Island (MY); Muhammad Afif Bin Abu Hussein, Penang Island (MY)

(73) Assignee: Sandisk Technologies, Inc., Milpitas, CA (US)

( * ) Notice: Subject to any disclaimer, the term of this patent is extended or adjusted under 35 U.S.C. 154(b) by 393 days.

(21) Appl. No.: 17/743,393

(22) Filed: May 12, 2022

(65) Prior Publication Data

US 2023/0371179 A1 Nov. 16, 2023

(51) Int. Cl.
*H05K 1/11* (2006.01)
*H01R 12/72* (2011.01)

(52) U.S. Cl.
CPC ........... *H05K 1/117* (2013.01); *H01R 12/721* (2013.01); *H01R 12/724* (2013.01); *H05K 2201/10189* (2013.01)

(58) Field of Classification Search
CPC ......... H05K 1/117; H05K 2201/10189; H01R 12/721; H01R 12/724
USPC .................................................. 439/39, 951
See application file for complete search history.

(56) References Cited

U.S. PATENT DOCUMENTS

| | | | | |
|---|---|---|---|---|
| 2,959,758 A * | 11/1960 | Kehl | ...................... | H05K 1/117 439/55 |
| 4,303,291 A * | 12/1981 | Dines | ...................... | H05K 3/28 430/311 |
| 4,941,530 A * | 7/1990 | Crowe | ...................... | F28F 3/025 361/698 |
| 5,236,372 A * | 8/1993 | Yunoki | ................... | H05K 1/117 439/59 |
| 5,713,126 A * | 2/1998 | Sakemi | ................ | H05K 3/3426 439/62 |
| 5,947,748 A * | 9/1999 | Licht | ...................... | H01R 29/00 439/59 |
| 6,634,561 B1 * | 10/2003 | Wallace | ........... | G06K 19/07732 235/441 |
| 7,422,445 B2 * | 9/2008 | Cheng | ................ | H01R 13/6595 439/945 |
| 7,645,146 B2 * | 1/2010 | Lindkamp | ............ | H01R 12/724 439/924.1 |
| 7,837,497 B1 * | 11/2010 | Matsuo | .................. | H05K 1/118 439/495 |
| 7,916,486 B2 * | 3/2011 | Takahashi | .............. | H05K 1/118 361/720 |
| 8,313,341 B1 * | 11/2012 | Falk | ...................... | H01R 24/64 439/482 |

(Continued)

FOREIGN PATENT DOCUMENTS

CN 206948710 U 1/2018
CN 113411959 A 9/2021

*Primary Examiner* — Gary F Paumen
(74) *Attorney, Agent, or Firm* — Patterson + Sheridan, LLP (57) ABSTRACT

A lead finger has a v-shaped contact point and a u-shaped profile. The u-shaped profile includes a portion that is disposed below a top surface of a PCB. The v-shaped contact point aids in guiding a host connector clip to an ideal location of the lead finger, where the ideal location may allow for more contact surface area and better contact to the host connector clip. The u-shaped profile may reduce impact force of the host connector clip to the lead finger.

14 Claims, 7 Drawing Sheets

(56) References Cited

U.S. PATENT DOCUMENTS

| | | | |
|---|---|---|---|
| 8,573,985 B2 * | 11/2013 | Patwardhan | H01R 12/714 439/74 |
| 8,641,453 B2 * | 2/2014 | Jung | H05K 1/117 439/951 |
| 2012/0083139 A1 * | 4/2012 | Jung | H05K 1/117 439/55 |

* cited by examiner

LEAD FINGER FOR PRINTED CIRCUIT BOARD

BACKGROUND OF THE DISCLOSURE

Field of the Disclosure

Embodiments of the present disclosure generally relate to a lead design for a printed circuit board (PCB).

Description of the Related Art

In order to transmit signals between one or more electronic devices as well as between one or more components of an electronic device, the communication is completed using one or more printed circuit boards (PCBs). PCBs include a plurality of fingers or leads, which are used as connecting contacts to a female-end of a receiving component. For example, the fingers may be used to connect the contacts of a motherboard to components on a daughter-board such as graphics cards, sound cards, processors, memory devices, and the like. The fingers typically are gold-plated columns that make it possible for different circuit boards to communicate with each other.

In order for signals to be sent to and from a PCB, the fingers of the PCB need to contact electrical contacts of a receiving component. Fingers typically have a flat shape, which may be due to simplifying production methods and lowering production costs. However, due to their flat shape, quality issues may arise over time due to wear and tear. For example, quality issues may include stripped fingers, bent fingers, peeled fingers, scratched fingers, and the like. The quality issues may result in lower signal transfer speeds or for the signals to be transmitted with errors.

Therefore, there is a need in the art for an improved lead finger.

SUMMARY OF THE DISCLOSURE

The present disclosure generally relates to an improved lead finger of a printed circuit board (PCB). The lead finger has a v-shaped contact point and a u-shaped profile. The u-shaped profile includes a portion that is disposed below a top surface of the PCB. The v-shaped contact point aids in guiding a host connector clip to an ideal location of the lead finger, where the ideal location may allow for more contact surface area and better contact to the host connector clip. The u-shaped profile may reduce an impact force of the host connector clip to the lead finger.

In one embodiment, a printed circuit board (PCB) includes a plurality of lead fingers. Each lead finger includes a first side, a second side coupled to the first side by a first beveled edge, a third side coupled to the first side by a second beveled edge, a fourth side coupled to the second side, a fifth side coupled to the third side and the fourth side, a first surface coupled to the first side, the second side, the fourth side, and a groove, and a second surface coupled to the first side, the third side, the fifth side, and the groove. The second side is opposite of the third side. The fourth side is disposed at a first angle from the second side. The fifth side is disposed at a second angle from the third side. The groove is formed between the second side and the third side. The groove intersects the first side, the fourth side, and the fifth side.

In another embodiment, a printed circuit board (PCB) includes a first surface having a first height, a second surface having a second height, and a third surface having a third height, and a finger including electrically conductive material disposed on at least a portion of the first surface, at least a portion of the second surface, and at least a portion of the third surface. The third surface is coupled to the first surface and the second surface. The first height and the second height are substantially similar. The third height is substantially less than the first height and the second height.

In another embodiment, a printed circuit board (PCB) includes a body having a first level and a second level and a lead finger disposed on the first level and the second level. The lead finger includes v-shaped means, u-shaped means, and means for guiding a host connector clip to a central portion of the lead finger. The second level is lower than the first level.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to an improved lead finger of a printed circuit board (PCB). The lead finger has a v-shaped contact point and a u-shaped profile. The u-shaped profile includes a portion that is disposed below a top surface of the PCB. The v-shaped contact point aids in guiding a host connector clip to an ideal location of the lead finger, where the ideal location may allow for more contact surface area and better contact to the host connector clip. The u-shaped profile may reduce impact force of the host connector clip to the lead finger.

Figure 1:
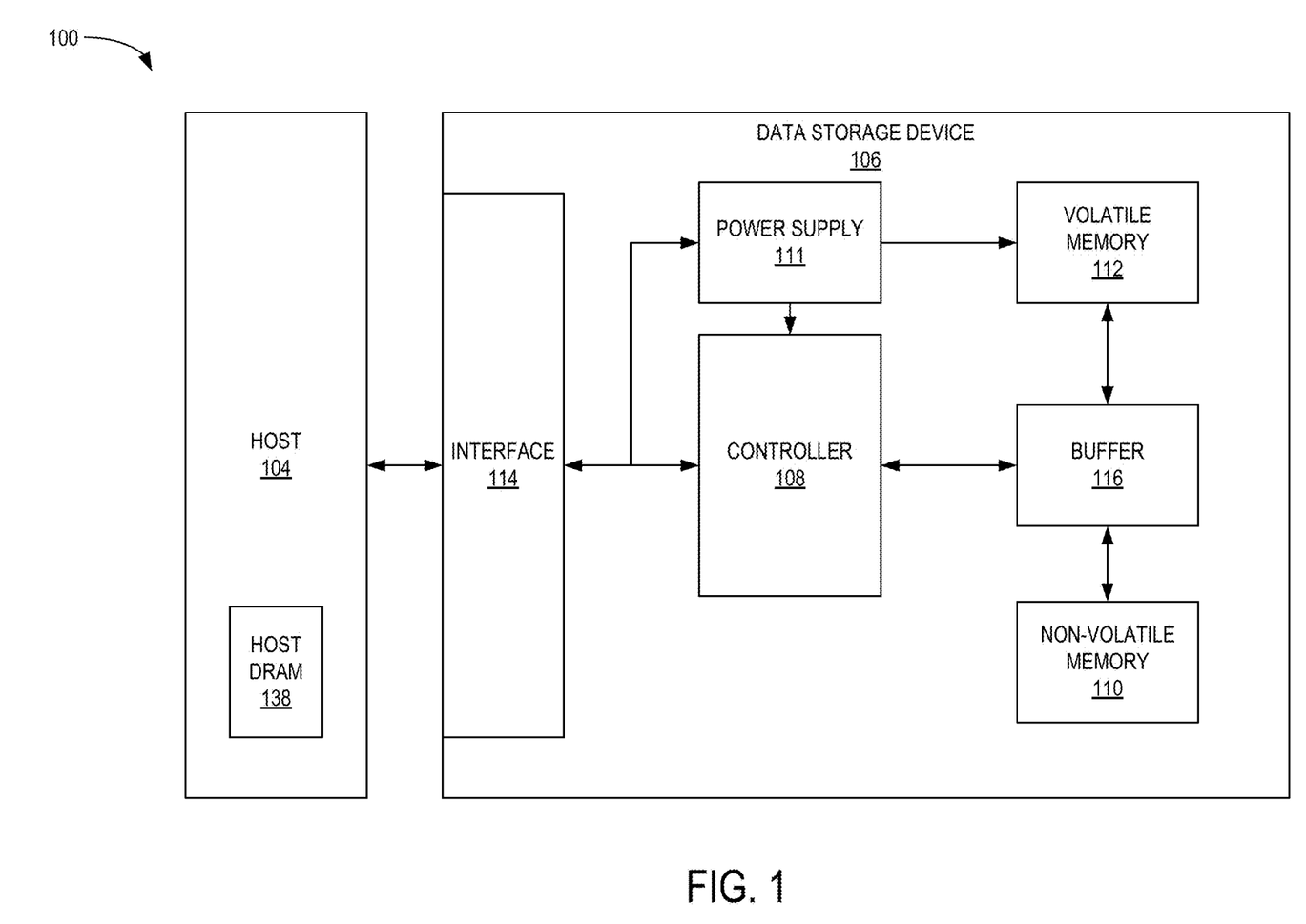
FIG. 1 is a schematic block diagram illustrating a storage system in which a data storage device may function as a storage device for a host device, according to certain embodiments.

FIG. 1 is a schematic block diagram illustrating a storage system 100 having a data storage device 106 that may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe ×1, ×4, ×8, ×16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Electronic devices, such as the host device 104 and the data storage device 106 may include one or more printed circuit boards (PCBs). Each physical component of the data storage device 106 described above may be coupled to a PCB, part of a PCB, or have a connection unit that resembles the lead fingers of the PCB. Thus, each of the processes described above may have some aspect utilizing lead fingers of a PCB in order to transmit signals to and from a another device. It is to be understood that the embodiments described herein are not limited to a data storage device, rather, embodiments relating to any component having a lead finger for interfacing with a compatible connector. For example, the compatible connector may be a another PCB. It is to be further understood that the embodiments described herein may be further applicable to other contacts that are similar to lead fingers used for other applications for transferring of data, power, and the like. The lead finger described herein may comprise an electrically conductive metal or a metal plated with an electrically conductive metal or alloy, such as gold, silver and copper, as should be understood by those of skill in the art.

Figure 2:
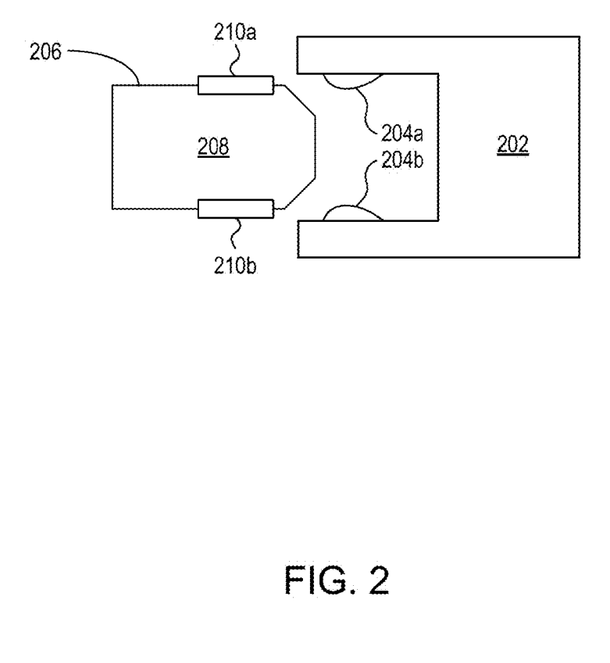
FIG. 2 is a schematic block diagram of a male-end of a PCB being inserted into a female-end of a receiving component, according to certain embodiments.

FIG. 2 is a schematic block diagram of a male-end of a PCB 206 being inserted into a female-end of a receiving component 202, according to certain embodiments. The PCB 206 includes a body 208, which may be the board of the PCB 206, and a plurality of electrically conductive contacts 210a, 210b disposed on the body 208. It is to be understood that the PCB 206 may include additional components not shown for simplification purposes. For example, the body 208 may further include, in a non-comprehensive list, transistors, resistors, signal traces, capacitors, inductors, oscillators, transformers, diodes, relays, fuses, batteries, light-emitting diodes (LEDs), switches, and the like. The plurality of electrically conductive contacts 210a, 210b may be gold plated, in order to allow for electrons to flow through the plurality of electrically conductive contacts 210a, 210b easily. In other words, the conductivity of the plurality of electrically conductive contacts 210a, 210b allows for signals to be transmitted via the plurality of electrically conductive contacts 210a, 210b. The plurality of electrically conductive contacts 210a, 210b may be lead fingers.

The receiving component 202 may be any electrical component having a female-end for connection with the plurality of electrically conductive contacts 210a, 210b of the PCB 206. For example, the receiving component 202 may be a daughterboard such as a graphics card, a video card, a sound card, RAM, NVM, a processor, and the like. The receiving component 202 includes a plurality of host connection clips 204a, 204b used to contact the plurality of electrically conductive contacts 210a, 210b in order to transmit signals via the plurality of electrically conductive contacts 210a, 210b. It is to be understood that a clip may be a pin. Likewise, it is contemplated that other synonymous words/phrases refer to the clip. The plurality of host connection clips 204a, 204b may be stressed outwards (i.e., towards a central area of the receiving component 202), such that the plurality of connection clips 204a, 204b, when making contact with the plurality of electrically conductive contacts 210a, 210b, exerts a force on the plurality of electrically conductive contacts 210a, 210b inwards. Because the plurality of host connection clips 204a, 204b may be stressed outwards, the contact force from inserting the PCB 206 in the receiving component 202 may damage the plurality of electrically conductive contacts 210a, 210b. For example, the plurality of electrically conductive contacts 210a, 210b may be stripped, scratched, peeled, and the like due to the force exerted by the plurality of host connection clips 204a, 204b on the plurality of electrically conductive contacts 210a, 210b.

Figure 3:
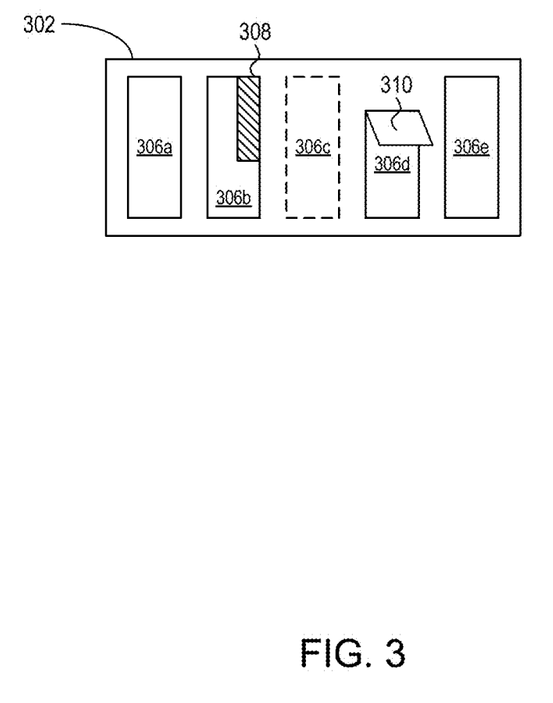
FIG. 3 is an exemplary illustration of PCB having a plurality of lead fingers, where potential lead finger damages are exemplified, according to certain embodiments.

FIG. 3 is an exemplary illustration of PCB 302 having a plurality of lead fingers 306a-306e, where potential lead finger damages are exemplified, according to certain embodiments. It is to be understood that the number of lead fingers of the plurality of lead fingers 306a-306e illustrated is not intended to be limiting, but to provide an example of a possible embodiment. The PCB 302 may be the PCB 206 of FIG. 2 and the plurality of lead fingers 306a-306e may be the plurality of electrically conductive contacts 210a, 210b of FIG. 2. It is to be understood that the lead fingers, as described herein, may comprise an electrically conductive material or is plated with an electrically conductive material.

For example, the electrically conductive material may be gold, copper, silver, or the like.

A first lead finger 306a and the a fifth lead finger 306e are not damaged. A second lead finger 306b and a fourth lead finger 306d exhibits damage. A third lead finger 306c is peeled off. The damages exhibited on the second lead finger 306b and the fourth lead finger 306d as well as the peeled off third lead finger 306c may be due to the contact force of the host connection clips, which may be the plurality of host connection clips 204a, 204b of FIG. 2, exerted on the second lead finger 306b, the third lead finger 306c, and the fourth lead finger 306d. The second lead finger 306b shows a contact scratch 308 and the fourth lead finger 306d shows a partially peeled portion 310 of the fourth lead finger 306d. Furthermore, the contact scratch 308 of the second lead finger 306b is off-centered, indicating that the host connection clip that was in contact with the second lead finger 306b was off-centered. Thus, the connection may not perform as effectively as if the host connection clip that was in contact with the second lead finger 306b was centered. For example, the signal strength of the connection may be decreased, which may lead to reduced electronic device performance. Likewise, the partially peeled portion 310 of the fourth lead finger 306d may eventually result in a fully peeled off lead finger, such as the third lead finger 306c. Thus, even though a contact may be made between a host connection clip and where the third lead finger 306c should be on the PCB 302, no signal may be transmitted between the host connection clip and where the third lead finger 306c should be on the PCB 302 due to a lack of an electrically conductive contact on the PCB 302.

Figure 4A:
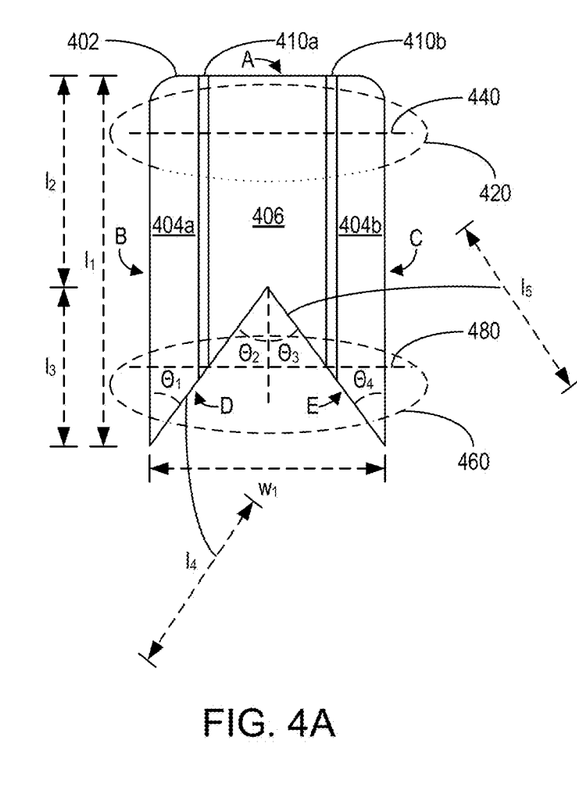
FIG. 4A is a top view of a lead finger, according to certain embodiments.

FIG. 4A is a top view 400 of a lead finger 402, according to certain embodiments. The top view 400 shows the lead finger 402 as having first side "A", a second side "B", a third side "C", a fourth side "D", and a fifth side "E". The first side "A" is coupled to the second side "B" and the third side "C", where the second side "B" and the third side "C" are substantially parallel to each other. The coupling between the first side "A" and the second side "B" as well as the coupling between the first side "A" and the third side "C" may be a beveled edge. It is to be understood that the abovementioned coupling may not be a beveled edge and may be a corner coupling. Furthermore, the first side "A" may be substantially perpendicular to the second side "B" and the third side "C". The fourth side "D" is coupled to the second side "B" at a first angle ($\Theta_1$) and the fifth side "E" is coupled to the fourth side "D" at a sum of a second angle ($\Theta_2$) and a third angle ($\Theta_3$). The fifth side "E" is further coupled to the third side "C" at a fourth angle ($\Theta_4$). Furthermore, the fourth side "D" and the fifth side "E" are disposed towards a center of the lead finger 402.

The first angle ($\Theta_1$) and the fourth angle ($\Theta_4$) may be substantially similar or substantially the same. In other words, the first angle ($\Theta_1$) and the fourth angle ($\Theta_4$) may similar or the same in order for the lead finger 402 to be symmetrical. The first angle ($\Theta_1$) and the fourth angle ($\Theta_4$) may be dependent on a first width ($w_1$) of the lead finger 402. For example, the first angle ($\Theta_1$) and the fourth angle ($\Theta_4$) may be equal to $$\tan\Theta = \left(\frac{w_1}{2}\right)/l_3,$$

where $\Theta$ is either $\Theta_1$ or $\Theta_4$. In another example, the first angle ($\Theta_1$) and the fourth angle ($\Theta_4$) are substantially equal to about 45 degrees. Likewise, the second angle ($\Theta_2$) and the third angle ($\Theta_3$) may be substantially similar or substantially the same. In other words, the second angle ($\Theta_2$) and the third angle ($\Theta_3$) may similar or the same in order for the lead finger 402 to be symmetrical. For example, the second angle ($\Theta_2$) and the third angle ($\Theta_3$) may be dependent on a first width ($w_1$) of the lead finger 402. For example, the second angle ($\Theta_2$) and the third angle ($\Theta_3$) may be equal to $$\tan\Theta = \left(\frac{w_1}{2}\right)/l_3,$$

where $\Theta$ is either $\Theta_2$ or $\Theta_3$. In another example, the second angle ($\Theta_2$) and the third angle ($\Theta_3$) are substantially equal to about 22.5 degrees, where the sum of the second angle ($\Theta_2$) and the third angle ($\Theta_3$) equals about 45 degrees. As used herein, when defining an term such as a length or an angle, the term "about" means plus or minus 5% of the defined value.

The second side "B" and the third side "C" each has a first length ($l_1$), where the first length ($l_1$) may be dependent on the PCB application to the female connector depth (e.g., the depth of the female-end of the receiving component). Thus, the first length ($l_1$) may be a variable dependent on the PCB design. The first length ($l_1$) may be split into a second length ($l_2$) and a third length ($l_3$), where the third length ($l_3$) indicates a depth of the opening formed by the corner coupling the second side "B" to the fourth side "D" and the corner coupling the third side "C" to the fifth side "E" and a sum of the second length ($l_2$) and the third length ($l_3$) equals the first length ($l_1$). The third length ($l_3$) may be equal to about ⅓ of the first length ($l_1$). Likewise, the fourth side "D" has a fourth length ($l_4$) and the fifth side "E" has a fifth length ($l_5$), where the fourth length ($l_4$) and the fifth length ($l_5$) may be calculated as $$l_4 = l_5 = l_3/\cos\Theta = \frac{w_1}{2}/\sin\Theta,$$

where $\Theta$ is either $\Theta_2$ or $\Theta_3$. Furthermore, the first side "A" is equal to the first width ($w_1$), where the first width ($w_1$) may be dependent on an application of the PCB. For example, the first width ($w_1$) of the lead finger 402 may be a variable dependent on the PCB design. Therefore, the first width ($w_1$) and the first length ($l_1$) may be determined by the PCB designer/manufacturer and the other dimensions may be determined based on the first width ($w_1$) and the first length ($l_1$) values. Additionally, a width of the opening formed by the corner coupling the second side "B" to the fourth side "D" and the corner coupling the third side "C" to the fifth side "E" is substantially equal to the first width ($w_1$).

The lead finger 402 has a first portion 404a, a second portion 404b, and a groove portion 406. The first portion 404a is coupled to the groove portion 406 by a first slanted portion 410a (shown on FIG. 4B). The groove portion 406b is coupled to the second portion 404b by a second slanted portion 410b (shown on FIG. 4B).

Corresponding areas of the lead finger 402 are indicated by non-solid lines to show either lengths or different views of the lead finger 402. For example, reference numeral 420 indicates an isometric view 420 of the back-end of the lead finger 402, reference numeral 440 indicates a cross-sectional view of the back-end of the lead finger 402, reference numeral 460 indicates an isometric view 406 of the front-end of the lead finger 402, and reference numeral 480 indicates a cross-sectional view of the front-end of the lead finger 402.

It is to be understood that terms "front-end" and "back-end" may refer to a relative position on the lead finger 402. For example, "front-end" may indicate a position on the lead finger 402 that is closer to the opening formed by the corner coupling the second side "B" to the fourth side "D" and the corner coupling the third side "C" to the fifth side "E", where a host connection clip, such as the first host connection clip 204a of FIG. 2, makes contact or is first in the vicinity of the "front-end" when the lead finger 402 is inserted in the female-end of a receiving component of an electronic device. Likewise, the "back-end" is towards the rear of the lead finger 402 or, in other words, the side furthest away from the opening formed by the corner coupling the second side "B" to the fourth side "D" and the corner coupling the third side "C" to the fifth side "E".

Figure 4B:
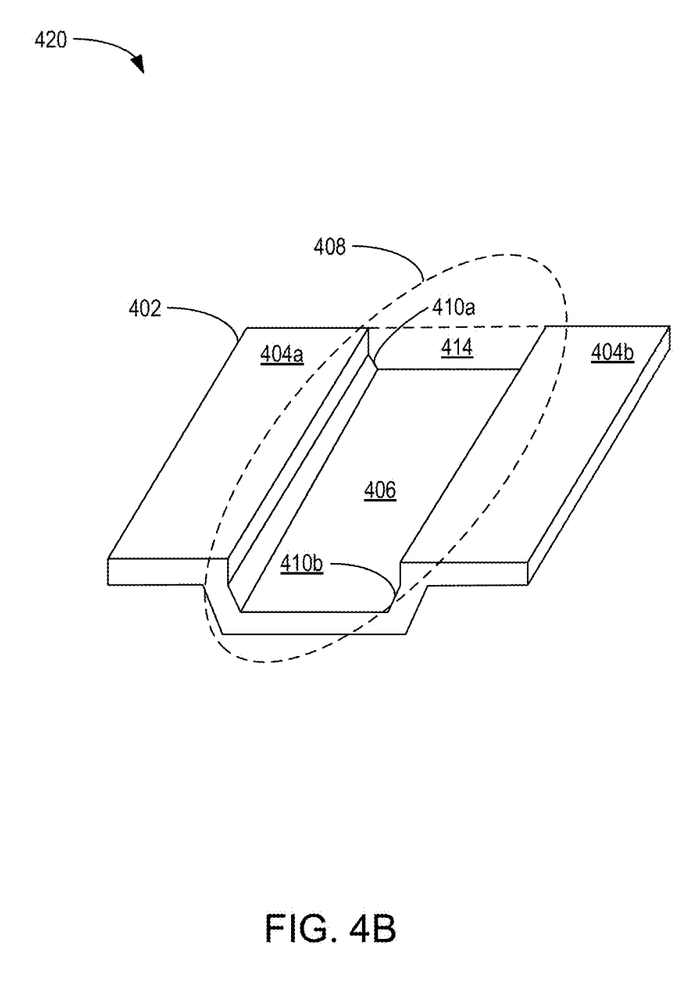
FIG. 4B is an isometric view of a back-end of the lead finger of FIG. 4A, according to certain embodiments.

FIG. 4B is isometric view 420 of a back-end of the lead finger 402 of FIG. 4A, according to certain embodiments. The isometric view 420 of the back-end of the lead finger 402 shows the first portion 404a coupled to the first slanted portion 410a, the first slanted portion 410a coupled to the groove portion 406, the groove portion 406 coupled to the second slanted portion 410b, and the second slanted portion 410b coupled to the second portion 404b. A groove 408 is formed by the first portion 404a, the first slanted portion 410a, the groove portion 406, the second slanted portion 410b, and the second portion 404b. In some embodiments, the groove 408 may be a beveled groove, such that corners are beveled corners. Furthermore, the lead finger 402 includes a back side 414. In some embodiments, the lead finger 402 may not include the back side 414.

Figure 4C:
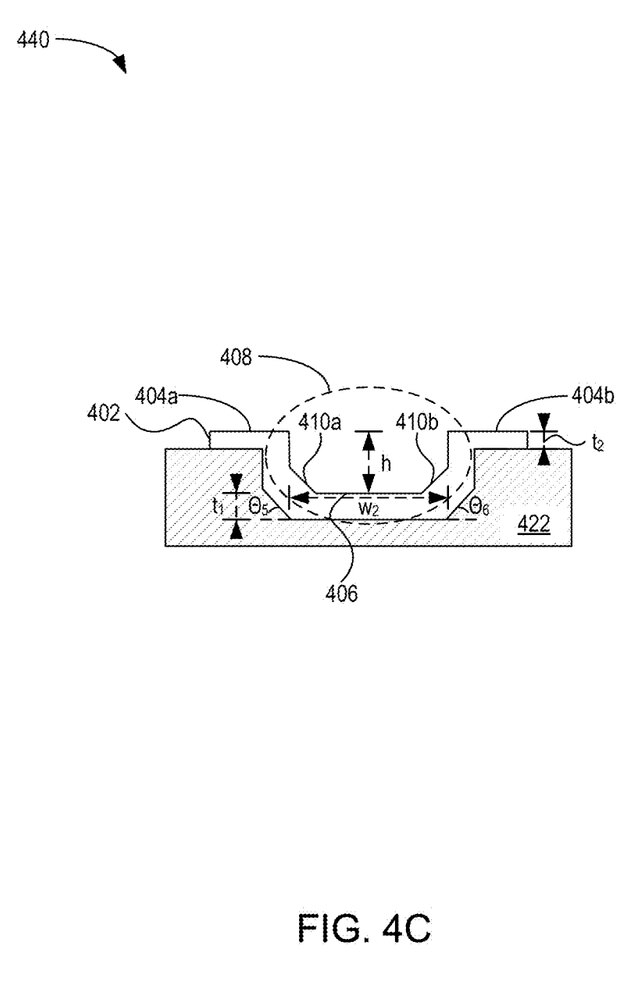
FIG. 4C is a cross-sectional view of a back-end of the lead finger of FIG. 4A, according to certain embodiments.

FIG. 4C is a cross-sectional view 440 of a back-end of the lead finger 402 of FIG. 4A, according to certain embodiments. As shown in the cross-sectional view 440, the groove 408 of the lead finger 402 is a u-shaped groove. The lead finger 402 is disposed on a body 422 of a PCB, where the body 422 may be the body 208 of the PCB 206 of FIG. 2. The groove 408 has a height (h), where the height (h) is the difference in height of a top surface of the groove portion 406 and a top surface of either the first portion 404a or the second portion 404b. The height (h) may be dependent on a usage frequency of the lead finger 402 as well as thickness of the electrically conductive plating on the lead finger 402. For example, the height (h) may be about 55% of the thickness of the electrically conductive plating or be between about 10 microinches (0.000254 mm) and about 70 microinches (0.001778 mm). Likewise, the groove 408 has a second width ($w_2$), where the second width ($w_2$) is the width of the opening of the groove. The second width ($w_2$) may be dependent on a width of the host connection clip. For example, the second width ($w_2$) may be about 15% greater than the width of the host connection clip. It is to be understood that the host connection clip width may be an average width of host connection clips used in industry or a maximum width of host connection clips used in industry.

The groove portion 406 has a first thickness ($t_1$). The first portion 404a and the second portion 404b each has a second thickness ($t_2$). In some examples, the first thickness ($t_1$) and the second thickness ($t_2$) are the substantially same. In other examples, the first thickness ($t_1$) and the second thickness ($t_2$) are substantially different. The first thickness ($t_1$) and the second thickness ($t_2$) may be between about 2 microinches (0.0000508 mm) and about 50 microinches (0.00127 mm).

The first slanted portion 410a is disposed at a fifth angle ($\Theta_5$) from a bottom edge of the groove portion 406 and the second slanted portion 410b is disposed at a sixth angle ($\Theta_6$) from the bottom edge of the groove portion 406. In some examples, the fifth angle ($\Theta_5$) and the sixth angle ($\Theta_6$) are substantially similar or the same. For example, the fifth angle ($\Theta_5$) and the sixth angle ($\Theta_6$) may be between about 40 degrees and about 45 degrees, where a difference between the fifth angle ($\Theta_5$) and the sixth angle ($\Theta_6$) is less than about 5 degrees. In another example, the fifth angle ($\Theta_5$) and the sixth angle ($\Theta_6$) are substantially equal to about 45 degrees.

Figure 4D:
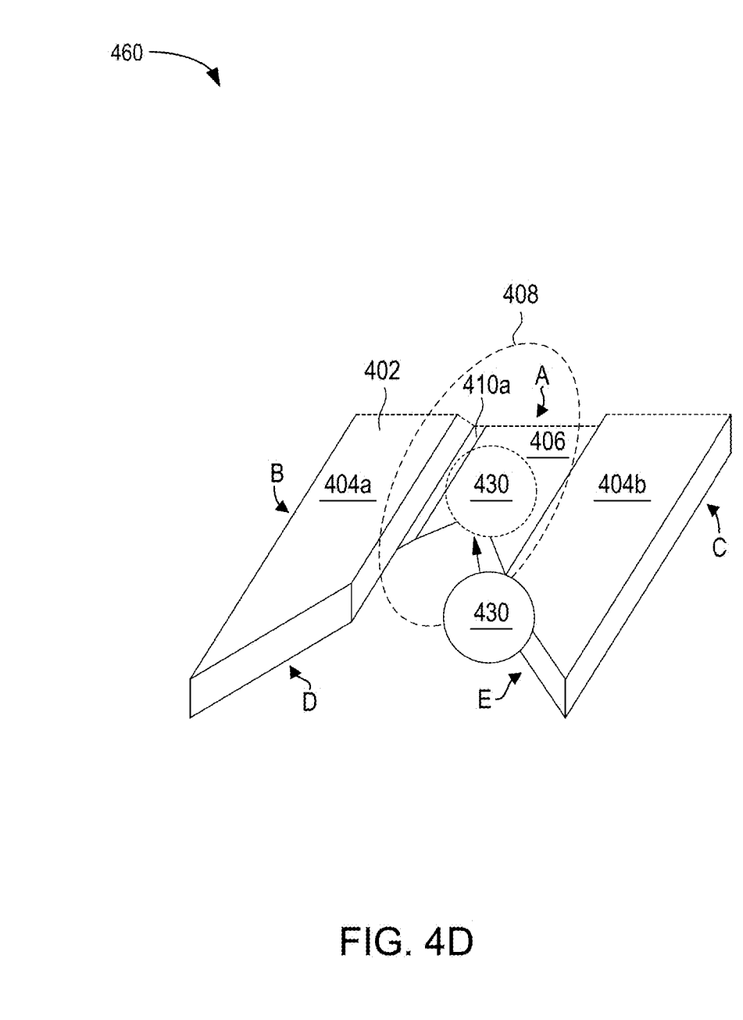
FIG. 4D is an isometric view of a front-end of the lead finger of FIG. 4A, according to certain embodiments.

FIG. 4D is an isometric view 460 of a front-end of the lead finger 402 of FIG. 4A, according to certain embodiments. The isometric view 460 of the back-end of the lead finger 402 shows the first portion 404a coupled to the first slanted portion 410a, the first slanted portion 410a coupled to the groove portion 406, the groove portion 406 coupled to the second slanted portion 410b (not shown), and the second slanted portion 410b (not shown) coupled to the second portion 404b. The groove 408 is formed by the first portion 404a, the first slanted portion 410a, the groove portion 406, the second slanted portion 410b (not shown), and the second portion 404b. In some embodiments, the groove 408 may be a beveled groove, such that corners are beveled corners. Furthermore, for exemplary purposes, sides "B", "C", "D", and "E" are labeled.

Figure 4E:
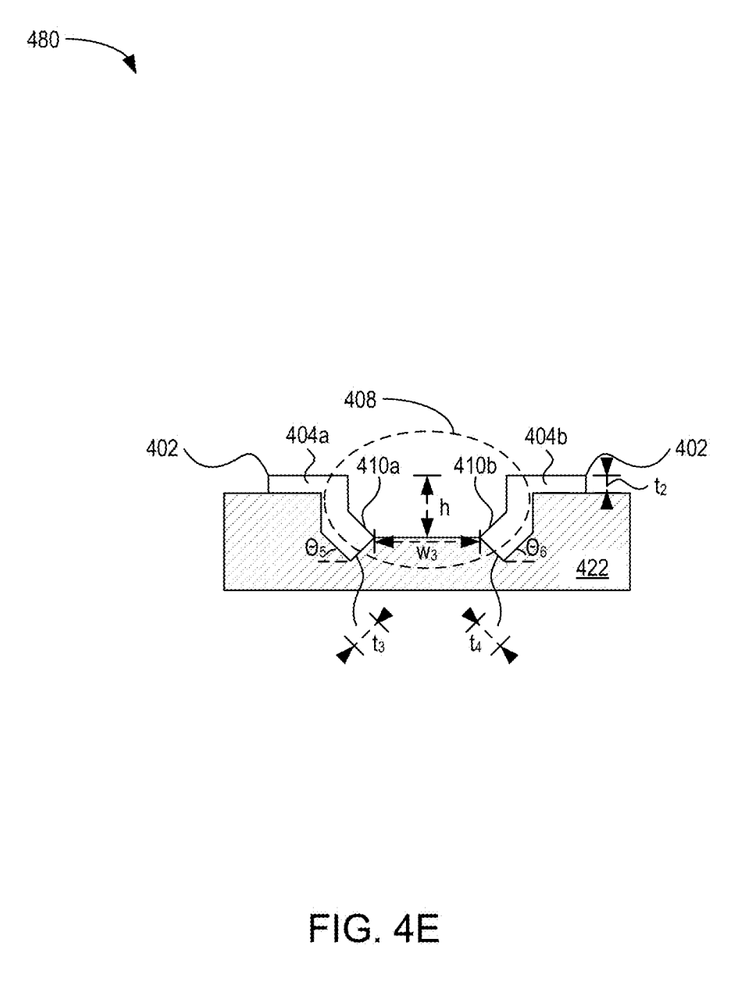
FIG. 4E is a cross-sectional view of a front-end of the lead finger of FIG. 4A, according to certain embodiments.

FIG. 4E is a cross-sectional view 480 of a front-end of the lead finger 402 of FIG. 4A, according to certain embodiments. As shown in the cross-sectional view 480, the groove 408 of the lead finger 402 is a u-shaped groove that is partially disposed therethrough the body 422. The groove 408 has a height (h), where the height (h) is the difference in height of a top surface of the body 422 (or, referring to the cross-sectional view 440 of the back-end of the lead finger, the groove portion 406) and a top surface of either the first portion 404a or the second portion 404b. The height (h) may be dependent on a usage frequency of the lead finger 402 as well as the thickness of the electrically conductive plating on the lead finger 402. For example, the height (h) may be about 55% of the thickness of the electrically conductive plating or be between about 10 microinches (0.000254 mm) and about 70 microinches (0.001778 mm).

Likewise, the groove 408 has a third width ($w_3$), where the third width ($w_3$) is the width of a top exposed surface of the body 422 in the groove 408. The third width ($w_3$) may be substantially proportional to a width of a host connection clip by a percentage of about 15% less than the second width ($w_2$). It is to be understood that the host connection clip width may be an average width of host connection clips used in industry or a maximum width of host connection clips used in industry.

The first slanted portion 410a has a third thickness ($t_3$) and the second slanted portion 410b has a fourth thickness ($t_4$). In some examples, the third thickness ($t_3$) and the fourth thickness ($t_4$) are the substantially same. In other examples, the third thickness ($t_3$) and the fourth thickness ($t_4$) are substantially different. The third thickness ($t_3$) and the fourth thickness ($t_4$) may be about 10% greater than the thickness of the first thickness ($t_1$). In some examples, the third thickness ($t_3$) and the fourth thickness ($t_4$) may be substantially similar in size or the substantially the same size as the first thickness ($t_1$) and the second thickness ($t_2$). In other examples, the third thickness ($t_3$) and the fourth thickness ($t_4$) may be different in size than the first thickness ($t_1$) and the second thickness ($t_2$).

Furthermore, FIG. 4E exemplifies a scenario where a host connection clip 430 (shown as a solid line), which may be the first host connection clip 204a of FIG. 2, when making an initial connection, is not centered with the lead finger 402. When the host connection clip 430 (shown as a solid line) comes in contact with one of the slanted sides (e.g., side "D" or side "E"), the host connection clip 430 (shown as a solid line) is guided to a central area of the lead finger 402, where the new position of the host connection clip 430 (shown as a dashed line) is in a central area of the lead finger 402. Furthermore, because the host connection clip 430 is guided to the central area of the lead finger 402, where the groove 408 is, a contact force of the host connection clip 430 on the lead finger 402 may be less than examples of lead fingers without the groove 408. Furthermore, because the groove 408 provides more surface area than examples of lead fingers without the groove 408, more connection points may available, which may improve signal transfer quality and strength.

Figure 5:
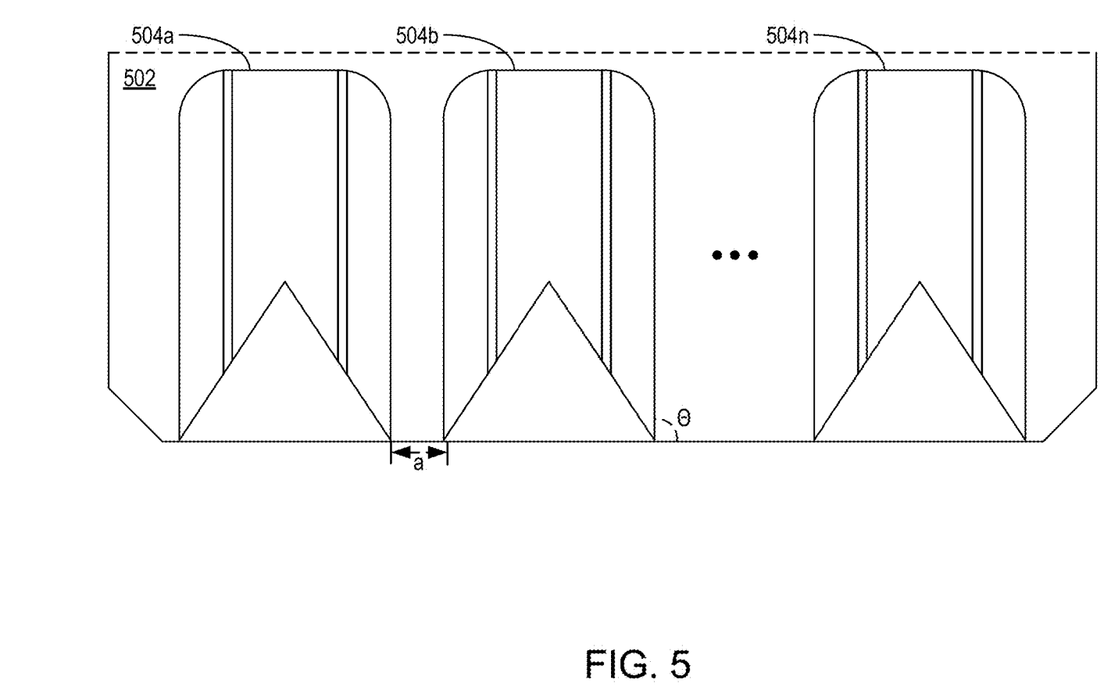
FIG. 5 is an exemplary illustration of a PCB having a plurality of lead fingers, where each lead finger may be the lead finger exemplified in FIGS. 4A-4E, according to certain embodiments.

FIG. 5 is an exemplary illustration of a PCB 502 having a plurality of lead fingers 504a-504n, where each lead finger of the plurality of lead fingers 504a-504n may be the lead finger 402 exemplified in FIGS. 4A-4E, according to certain to embodiments. The dashed line of the PCB 502 may indicate that there are other components of the PCB 502 not shown for simplification purposes. Furthermore, it is to be understood that the number of lead fingers of the plurality of lead fingers 504a-504n is not limited, and may be different based on a configuration type selected during production of the PCB 502.

Each lead finger of the plurality of lead fingers 504a-504n may be separated from an adjacent lead finger of the plurality of lead fingers 504a-504n by a distance "a", where the distance "a" may be between about 0.3 mm and about 0.5 mm. However, the distance "a" may depend on the pitch of a lead finger of the plurality of lead fingers 504a-504n and an application type of the female connector design and size (e.g., the female-end of the receiving component) and may be different than the previously mentioned values.

Furthermore, each lead finger of the plurality of lead fingers 504a-504n may be angled relative to an edge of the PCB 502. For example, relative to the male-end edge of the PCB 502, the angle ($\Theta$) may be about 90 degrees. However, in other embodiments, the angle ($\Theta$) may be at an angle other than 90 degrees, such as between about 75 degrees and about 105 degrees relative to the male-end edge of the PCB 502. Thus, the angle ($\Theta$) being at about 90 degrees or at an angle other than 90 degrees, such as between the values listed above, may aid in guiding a host connection clip towards a central portion of the lead finger in order to improve contact between the host connection clip and the lead finger and decrease a risk of damaging the lead finger.

By changing a design of a lead finger to include a groove for lessening contact force of a host connection clip and the lead finger and a triangular opening for guiding host connection clips to a central area of the lead finger, signal transfer strength, signal transfer quality, and the durability of the lead finger or the conductive plating thereon may be improved.

In one embodiment, a printed circuit board (PCB) includes a plurality of lead fingers. Each lead finger includes a first side, a second side coupled to the first side by a first beveled edge, a third side coupled to the first side by a second beveled edge, a fourth side coupled to the second side, a fifth side coupled to the third side and the fourth side, a first surface coupled to the first side, the second side, the fourth side, and the groove, and a second surface coupled to the first side, the third side, the fifth side, and the groove. The second side is opposite of the third side. The fourth side is disposed at a first angle from the second side. The fifth side is disposed at a second angle from the third side. A groove is formed between the second side and the third side. The groove intersects the first side, the fourth side, and the fifth side.

The groove includes a sixth side coupled to the first surface at a third angle, a seventh side coupled to the sixth side at a fourth angle, an eighth side coupled to the seventh side at a fifth angle, a ninth side coupled to the eighth side at a sixth angle, and a tenth side coupled to the ninth side at a seventh angle and the second surface at an eighth angle. The sixth angle and the fifth angle are substantially similar. The seventh angle and the fourth angle are substantially similar. The eighth angle and the third angle are substantially similar. The sixth side and the eighth side are substantially perpendicular to each other. The tenth side and the eighth side are substantially perpendicular to each other. The eighth side is substantially parallel to the first surface and the second surface. The third angle and the eighth angle are equal to about 90 degrees. The fourth angle and the seventh angle are between about 40 degrees and about 45 degrees. The fifth angle and the sixth angle are between about 40 degrees and about 45 degrees. A height of the groove is between about 0.000254 mm and about 0.001778 mm. A width of the groove is equal to about 15% greater than a width of a host connection clip. The groove has a u-shaped cross-section. A lead finger of the plurality of lead fingers comprises a total depth. The total depth equals a first depth plus a second depth. The first depth is a length of an adjacent side to the first angle of a right triangle formed by the fourth side and a portion of the second side. The second depth is a length of a remaining portion of the second side. Each lead finger of the plurality of lead fingers is disposed at an angle between about 75 degrees and about 105 degrees relative to a male-end edge of the PCB. A distance between adjacent lead fingers of the plurality of lead fingers is between about 0.3 mm and about 0.5.

In another embodiment, a printed circuit board (PCB) includes a first surface having a first height, a second surface having a second height, and a third surface having a third height, and a lead finger disposed on at least a portion of the first surface, at least a portion of the second surface, and at least a portion of the third surface. The third surface is coupled to the first surface and the second surface. The first height and the second height are substantially similar. The third height is substantially less than the first height and the second height.

The lead finger includes at least one of an electrically conductive material or a metal plated with an electrically conductive material. A portion of the finger that is disposed on the at least a portion of the third surface is partially disposed therethrough the third surface. The at least a portion of the third surface forms a triangular shape. A first portion of the finger that is disposed on the at least a portion of the first surface has a trapezoidal shape and a second portion of the finger that is disposed on the at least a portion of the second surface has the trapezoidal shape. The trapezoidal shape includes a rectangular portion and a triangular portion. The triangular portion is disposed facing towards a male-end of the PCB. The triangular shape is disposed facing away from the male-end of the PCB. The finger further includes a back portion. The back portion is substantially perpendicular to the at least a portion of the first surface, the at least a portion of the second surface, and the at least a portion of the third surface.

In another embodiment, a printed circuit board (PCB) includes a body having a first level and a second level and a lead finger disposed on the first level and the second level.

The lead finger includes v-shaped means, u-shaped means, and means for guiding a host connector clip to a central portion of the lead finger. The second level is lower than the first level.

The lead finger further includes means to provide greater surface area for contact with the host connector clip than a lead finger not having the means for guiding a host connector clip to the central portion of the lead finger. The lead finger further comprises means to provide for better contact of the host connector clip to the lead finger than a lead finger not having the means for guiding a host connector clip to a central portion of the lead finger.

While the foregoing is directed to embodiments of the present disclosure, other and further embodiments of the disclosure may be devised without departing from the basic scope thereof, and the scope thereof is determined by the claims that follow.

What is claimed is:

1. A printed circuit board (PCB), comprising:
a plurality of lead fingers disposed on a body of the PCB, wherein each lead finger comprises:
 a first side;
 a second side;
 a third side, wherein the second side is substantially parallel to the third side;
 a fourth side coupled to the second side, wherein the fourth side is disposed at a first angle from the second side;
 a fifth side coupled to the third side, wherein the fifth side is disposed at a second angle from the third side;
 a groove portion;
 a first portion coupled to the groove portion by a first slanted portion; and
 a second portion coupled to the groove portion by a second slanted portion.

2. The PCB of claim 1, wherein:
the first slanted portion is disposed at a third angle from a bottom edge of the groove portion; and
the second slanted portion is disposed at a fourth angle from the bottom edge of the groove portion, wherein the third angle and the fourth angle are substantially similar.

3. The PCB of claim 2, wherein:
the third angle and the fourth angle are between about 40 degrees and about 45 degrees.

4. The PCB of claim 1, wherein a height of the groove is between about 0.000254 mm and about 0.001778 mm.

5. The PCB of claim 1, wherein a width of the groove is equal to about 15% greater than a width of a host connection clip.

6. The PCB of claim 1, wherein the groove has a u-shaped cross-section.

7. The PCB of claim 1, wherein:
the second side and the third side have a first length, wherein the first length is equal to a sum of a second length and a third length; and
the third length is a depth of an opening formed by a coupling of the fourth side to the second side, and a coupling of the fifth side to the third side.

8. The PCB of claim 1, wherein each lead finger of the plurality of lead fingers is disposed at an angle between about 75 degrees and about 105 degrees relative to a male-end edge of the PCB body.

9. The PCB of claim 1, wherein a distance between adjacent lead fingers of the plurality of lead fingers is between about 0.3 mm and about 0.5 mm.

10. A printed circuit board (PCB), comprising:
a plurality of lead fingers disposed on a body of the PCB, wherein each lead finger comprises a groove formed by:
 a groove portion having a first thickness;
 a first slanted portion coupled to the groove portion;
 a first portion coupled to the first slanted portion;
 a second slanted portion coupled to the groove portion; and
 a second portion coupled to the second slanted portion, wherein:
 a thickness of the first and second portions are the same; and
 the thickness of the groove portion is substantially different from the thickness of the first and the second portions.

11. The PCB of claim 10, wherein a lead finger of the plurality of lead fingers includes at least one of an electrically conductive material or a metal plated with an electrically conductive material.

12. The PCB of claim 10, wherein the groove is partially disposed therethrough the body.

13. The PCB of claim 11, wherein the groove is u-shaped, and wherein a height of the groove is based on a thickness of the at least one electrically conductive material or the metal plating with the electrically conductive material.

14. The PCB of claim 10, wherein a lead finger of the plurality of lead fingers further comprises a first side, a second side, and a third side, wherein the first side is substantially perpendicular to the second side and third side.

* * * * *